United States Patent [19]

Hiruma et al.

[11] Patent Number: 4,769,308

[45] Date of Patent: Sep. 6, 1988

[54] DRY PRESENSITIZED PLATE WITH PHOTOSENSITIVE LAYER CONTAINING ORGANOTIN

[75] Inventors: Toshihiko Hiruma; Hiroshi Takahashi; Yasuhisa Naritomi, all of Shizuoka, Japan

[73] Assignee: Fuji Photo Film Co., Ltd., Kanagawa, Japan

[21] Appl. No.: 927,080

[22] Filed: Nov. 5, 1986

[30] Foreign Application Priority Data

Nov. 11, 1985 [JP] Japan ............................... 60-252416
Jan. 29, 1986 [JP] Japan ................................. 61-17563

[51] Int. Cl.$^4$ ................................................ G03C 1/76
[52] U.S. Cl. .................................... 430/272; 430/270; 430/271; 430/275; 430/278; 430/281; 430/300
[58] Field of Search ............... 430/270, 271, 272, 275, 430/276, 278, 280, 281, 283, 285, 300

[56] References Cited

U.S. PATENT DOCUMENTS

| | | | |
|---|---|---|---|
| 4,164,422 | 8/1979 | Okai et al. | 430/272 |
| 4,254,209 | 3/1981 | Abe et al. | 430/272 |
| 4,342,820 | 8/1982 | Kinashi et al. | 430/272 |
| 4,347,303 | 8/1982 | Asano et al. | 430/273 |
| 4,461,825 | 7/1984 | Kato et al. | 430/273 |
| 4,568,629 | 2/1986 | Kinashi et al. | 430/272 |
| 4,590,148 | 5/1986 | Takahashi et al. | 430/272 |

FOREIGN PATENT DOCUMENTS 1442368 7/1976 United Kingdom .

OTHER PUBLICATIONS

Grant, Hach's Chemical Dictionary, Fourth Edition, p. 476, 1965.

*Primary Examiner*—Jack P. Brammer
*Attorney, Agent, or Firm*—Burns, Doane, Swecker & Mathis

[57] ABSTRACT

A presensitized plate for use in making a lithographic printing plate requiring no dampening water which comprises a substrate having provided thereon a primer layer, a photodimerizable photosensitive layer containing at least one organotin compound and at least one silane coupling agent in a total amount of 0.1 to 20% by weight of the photosensitive resin and a silicone rubber layer, in order, the photosensitive layer of the presensitized plate is formed by previously incorporating the above two compounds into a photosensitive resin composition and then applying the composition to the surface of the primer layer or by contacting a solution containing the compounds with the previously formed photosensitive layer and penetrating the solution into the photosensitive layer. The dry presensitized plate is extremely strong in adhesiveness between the primer layer and the photosensitive layer and exhibits a relatively broad developing latitude and a good image reproducibility.

14 Claims, No Drawings

DRY PRESENSITIZED PLATE WITH PHOTOSENSITIVE LAYER CONTAINING ORGANOTIN

BACKGROUND OF THE INVENTION

1. Field of the Invention

The present invention relates to a dry presensitized plate, more particularly to a dry presensitized plate for use in making a dry lithographic printing plate requiring no dampening water and having an extremely wide developing latitude as well as a method of manufacturing the same.

2. Description of the Prior Art

The conventional lithographic printing technique is characterized in that water applied to non-image areas of a printing surface is not compatible with oil printing ink or it serves as an ink repellent.

However, in the conventional lithographic printing technique, there have been a number of problems accompanied by the fact that the dampening water and the oil ink coexist with each other on a printing matrix. For example, a part of the dampening water to be applied to the matrix causes back-flow in a printing machine during printing procedures, which, in turn, causes the contamination and emulsification of the oil ink. Moreover, the dampening water flows through the offset drum and gets printing papers wet which results in the curling and dimension change of the paper. Furthermore, it is, in general, required to maintain a delicate equilibrium between the amount of dampening water and oil ink so as to obtain a uniform and precise image, the equilibrium being one of the most important factors, in the wet lithographic printing technique and as a result a desired quality of printed product are assured.

Under these circumstances, a dry presensitized plate has recently been proposed and widely put into practical use. Such dry presensitized plate generally comprises a substrate and a photosensitive layer and a silicone rubber layer which are deposited, in order, on the surface of the substrate. Examples of the dry presensitized plate having such construction are disclosed in, for instance, Japanese Patent Publication Nos. 23042/1969, 16044/1971, 17081/1976, 26923/1979 and 22781/1980.

Among them, the dry presensitized plate disclosed in Japanese Patent Publication No. 22781/1980, in which a photodimerizable photosensitive resin is used, has an advantageous property such that it is not influenced with oxygen during the plate making process and the exposure process and that it is not influenced by the exposure temperature, thereby such plate makes it possible to manufacture the lithographic printing plate more stably than a plate in which a photopolymerizable composition is utilized.

There have been proposed two methods for making such a dry presensitized plate, one of which comprises dissolving a photosensitive layer of image areas with a developing liquid (developer) to remove a silicone rubber layer deposited thereon and thus obtaining the image areas (see, Japanese Patent Publication No. 16044/1971) and the other of which comprises selectively removing a silicone rubber layer of image areas utilizing the photoadherent property and photorelease property of a photosensitive layer (see, Japanese Patent Publication No. 26923/1979 and Japanese Patent Laid-Open Appln. No. 80046/1981).

The former presents an advantage such that the development is not affected by the bonding strength between the silicone rubber layer and the photosensitive layer. This is because, the removal of the photosensitive layer is carried out by dissolving the same with a developer, in this method. Thus, according to this method, it is expected to produce a printing plate having a rather high resistance to scratch and a high wear resistance during development and/or press operations without impairing the developing property thereof.

However, in the latter method, the printing plate produced has not an excellent developing property, since the developing property is strongly influenced by the bonding strength between the silicone rubber layer and the photosensitive layer. Therefore, it is difficult to obtain a printing plate excellent in its resistant to scratches and wear resistance according to this method.

In general, a photosensitive layer should be as thin as possible in such a method wherein the photosensitive layer is removed by dissolving it with, for instance, a developer. In such method, image areas are constituted by concave area formed after the dissolution of both silicone rubber layer and photosensitive layer. Therefore, the concave area of the printing plate becomes quite deep and this causes problems explained below. In such cases, when an amount of ink supplied to the concave areas during printing operation is small, the ink cannot be transferred to printing paper, especially in highlight areas.

Under these circumstances, the inventors of this invention have conducted various studies to overcome the foregoing disadvantages accompanied by the prior art and found that these disadvantages can effectively be eliminated by providing a dry presensitized plate comprising a primer layer composed of a specific material strictly selected, a photodimerizable photosensitive layer and a silicone rubber layer deposited on a substrate in this order. The dry presensitized plate having such structure makes it possible to reduce the thicknesss of the photosensitive layer and to apply ink to the surface thereof in thick. Furthermore, the plate is excellent in its resistance to scratches and wear resistance.

It is sometimes necessary to strongly develop the dry presensitized plate. In such case, the photosensitive layer is peeled off from the primer layer and a good image is not produced in a sufficient reproducibility, that is only a narrow developing latitude is resulted. Alternatively, the inventors of this invention tried to use a silane coupling agent or a mixture thereof in order to enhance the adhesiveness between the primer layer and the photosensitive layer and enlarge the developing latitude, the silane coupler being generally used as the agent for improving the adhesiveness between organic materials (layers); or an organic material and an inorganic material. However, desired effects have not been obtained at all.

SUMMARY OF THE INVENTION

The inventors of this invention have eagerly conducted studies to develop an improved dry presensitized plate having an increased adhesiveness between a primer layer and a photosensitive layer and an enlarged developing latitude and found that, for that purpose, it is effective to incorporate strictly selected additives into the photosensitive layer and thus they have completed this invention.

The principal object of this invention is to provide a dry presensitized plate improved in its adhesiveness between the two layers mentioned above as well as its development latitude.

A further object of this invention is to provide a dry lithographic printing plate having an extremely good durability.

A still further purpose of this invention is to provide a method for manufacturing the intended dry presensitized plate for use in making a dry lithographic printing plate requiring no dampening water.

The above mentioned and other objects of this invention can effectively be accomplished by providing a new improved dry presensitized plate which comprises a substrate having provided thereon a primer layer, a photodimerizable photosensitive layer and a silicone layer, in order and characterized in that the photosensitive layer contains at least one organotin compound and at least one silane coupling agent.

DETAILED EXPLANATION OF THE INVENTION

A substrate which can be used in this invention may be any materials provided that they have a sufficient flexibility to set it on usual lithographic printing machines and that they can bear the load applied thereto during printing operations. Typical examples thereof are metal plates such as aluminum, copper and steel; plastic films or sheets such as polyethylene terephthalate, coated papers, rubber sheets.

Moreover, a composite substrate, a substrate having rubber elasticity or rubber elastic layer and a cylindrical substrate can also be used in this invention.

The primer layer as used in the present invention must fulfill the following requirements. First of all, it strongly adheres to the adjacent photosensitive layer and the substrate. Secondary, the primer layer must receive ink (or must be compatible with ink) and have a good resistance to the solvent of a developer used, in the case where the primer layer is exposed after the exposure and developing processes.

Examples satisfying these requirements include epoxy resins and polyurethane resins which are thermoset with a suitable hardener and among these, epoxy resins are preferred. Typical examples of the epoxy resins as used herein are the following resins:

a. Reaction products of bishenol A and epichlorohydrin;
b. Reaction products of a novolak resin and epichlorohydrin;
c. Reaction products of bisphenol F and epichlorohydrin;
d. Reaction products of tetrabromobisphenol A and epichlorohydrin;
e. Cycloaliphatic epoxy resins (compounds including a cyclohexene oxide group, a tricyclodecene oxide group, a cyclopentene oxide group);
f. Glycidyl ester type epoxy resins (for instance, a reaction product of a polycarboxylic acid and epichlorohydrin);
g. Glycidyl amine type epoxy resins (for instance, a reaction product of an amine and epichlorohydrin);
h. Heterocyclic epoxy resins (for example, a hydantoin type epoxy resin having a glycidyl group on the hydantoin ring and a triglycidyl isocyanarate having a triazine ring).

The epoxy resins as used herein may be any known epoxy resins other than those listed above, provided that they have at least one epoxy group per molecule on the average. In particular, the most preferred examples are the bisphenol A type epoxy resins mentioned above (see, item a) having the following general formula:

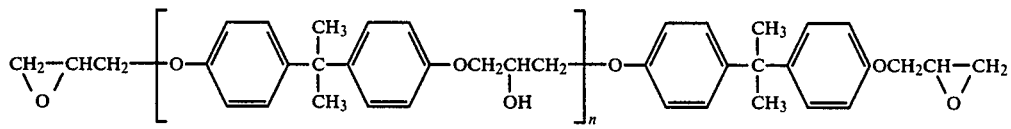

(wherein n is an integer of 0 to 20). Such epoxy resins have a variety of epoxy equivalent and the preferred are those having an epoxy equivalent of from 180 to 4,000.

These epoxy resins are cured according to any one of the following methods:

(1) a method in which epoxy groups are subjected to self-polymerization utilizing a catalyst such as a tertiary amine or boron trifluoride;

(2) a curing method in which an addition reaction of a compound having active hydrogens and epoxy groups is utilized; such compounds having active hydrogens including (i) polyamines (aliphatic or aromatic polyamines), (ii) polyamide-polyamine resins, (iii) polycarboxylic acids, (iv) polymercaptan or the like;

(3) a curing method wherein a copolymerization or condensation of epoxy group and another compound such as acid anhydrides. The most effective result can be expected when an acid anhydride is used as the curing agent and a tertiary amine is used as the curing acceleratar.

The acid anhydride serving as the curing agent is used in an amount of from 2 to 100% by weight based on the weight of the epoxy resin. In general, the preferred amount of the anydride used varies depending on the kind and the properties of the epoxy resin and acid anhydride interested, for example, when the epoxy resin having the epoxy equivalent of 500 and the acid anhydride having the acid anhydride equivalent of 150 are used, preferred amount of the latter falls within the range of from 10 to 50% by weight.

While the tertiary amine as the curing accelerator is added in an amount of from 0.5 to 30% by weight based on the weight of the epoxy resin used and particularly the preferred amount thereof falls within the range of from 5 to 20% by weight.

The primer layer can be applied to the surface of the substrate by, for example, dissolving an epoxy resin, an acid anhydride and a tertiary amine in a suitable organic solvent, then applying the solution onto the surface of the substrate and heating the solution applied at a temperature of from 80° to 150° C. to cause curing.

The thickness of the primer layer desirably falls within the range of from 0.1 to 50 μm, more preferably 0.5 to 10 μm.

In the present invention, it is also possible to add a modifier such as flexibilizers and a filler such as titanium oxide to the epoxy resins mentioned above, according to need.

Moreover, an antihalation agent, a colorant for imparting the image printing out property to the primer layer or the like may be used according to need.

In this respect, materials capable of imparting the printing out property to the layer may be any compounds which cause color change at the exposed portion and provide a sufficient contrast between the exposed area and the nonexposed area even under yellow light so as to form a visible image.

Examples of such material imparting the printing out property to the layer after exposure include (i) a combination of at least one compound capable of generating acids by exposure and at least one acid base indicator, (ii) a combination of at least one compound capable of generating free radicals by exposure and at least one agent causing color change by the action of the free radicals or (iii) at least one colorant causing, per se, color change by the action of light. As the compound capable of generating acids by exposure (the photolytically acid generating agent), there may be mentioned such as photosensitive diazo compounds, o-naphthoquinone diazide compounds, aromatic compounds having trihalomethyl group(s), for example, oxadiazole compounds or S-triazine compounds having a trihalomethyl group. The preferred examples of such oxadiazole or S-triazine compound are as follows:

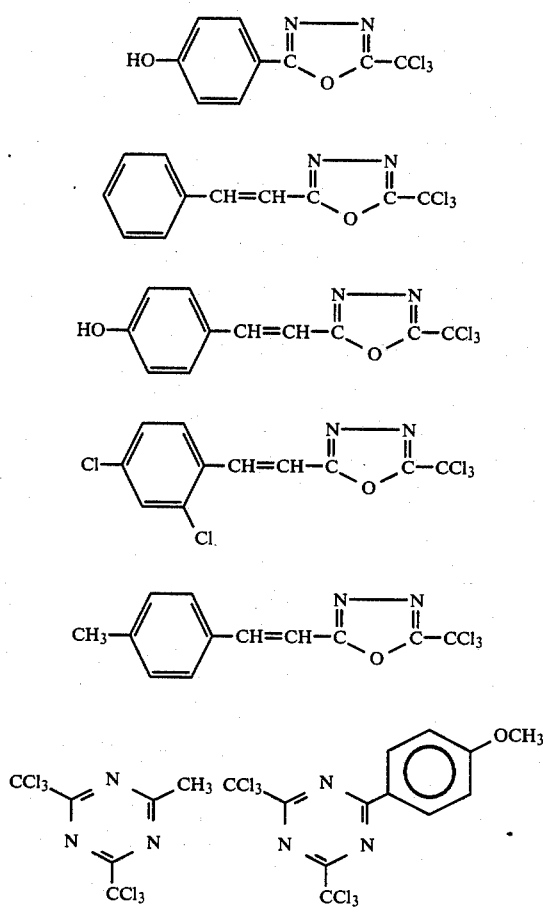

-continued

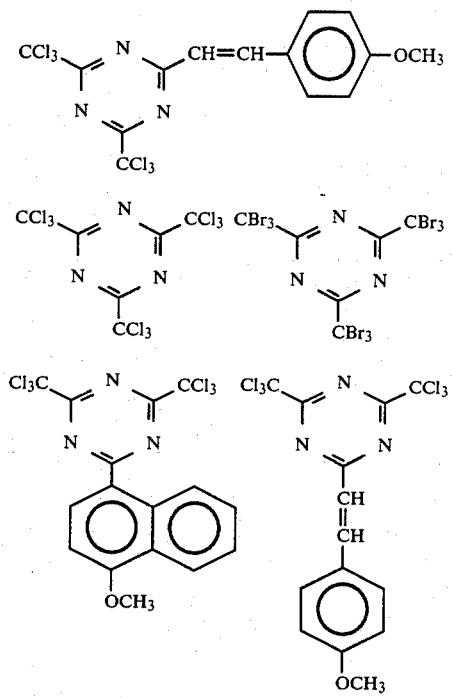

While the acid base indicators as used in the present invention include Methyl Violet (0.5), Malachite Green (0.5–1.5), benzeneazobenzyl amine (2.2–3.5), Methyl Orange (3.1–4.4), lacmoid (4.4–6.4), Bromocresol Purple (5.2–6.8), Neutral Red (6.8–8.0), α-Naphtholphthalein (7.3–8.7), purpurin (8.5–9.5), Thymolphthalein (9.3–10.5), Alizarin Yellow (10.2–12.0), Tropaeolin 0 (11.1–12.7), acidic Fuchsine (12.0–14.0). The numerical value or range enclosed in each bracket means the pH range wherein each indicator causes color change.

The amount of the acid generating agent used is desirably in the range of from 0.1 to 20%, preferably 0.2 to 10% by weight of the solid component of the primer layer. While the amount of the acid base indicator falls within the range of from 0.1 to 10, preferably 0.2 to 5% by weight of the solid component of the primer layer.

The compounds generating free radicals by exposure as used in the present invention may be any kinds of photolytic free radical generators and the oxadiazole compounds and S-triazine compounds having trihalomethyl groups already mentioned above can be used as the preferred free radical generator. The amount thereof used falls within the range of from 0.2 to 20, preferably 0.2 to 10% by weight of the solid component of the primer layer, though it varies depending on the free radicals generating efficiency of each generator used. Moreover, the agent causing color change due to the action of the coexisting free radicals as used in the present invention are, for example, arylamines. As the arylamine suitable for such purpose, there may be mentioned such as primary and secondary aromatic amines as well as so-called leuco pigments and examples thereof include diphenylamine, dibenzylaniline, triphenylamine, diethylaniline, diphenyl-p-phenylenediamine, p-toluidine, 4,4'-biphenyldiamine, o-chloroaniline, o-bromoaniline, 4-chloro-o-phenylenediamine, o-bromo-N,N-dimethylaniline, 1,2,3-triphenylguanidine, naphthylamine, diaminodiphenylmethane, aniline, 2,5-dichloroaniline, N-methyldiphenylamine, o-toluidine, p,p'-tetramethyldiaminodiphenylmethane, N,N-dimethyl-p-phenylenediamine, 1,2-dianilinoethylene, p,p'p''-hexamethyltriaminotriphenylmethane, p,p'-tetramethyldiaminotriphenylmethane, p,p'-tetramethyldiaminodiphenylmethylimine, p,p',p''-triamino-o-methyltriphenylmethane, p,p',p''-triaminotriphenylcarbinol, p,p'-tetramethylaminodiphenyl-4-anilinonaphthylmethane, p,p'p''-triaminotriphonylmethane, p,p',p''-hexapropyltriaminotriphenylmethane.

The amount of these compounds added falls within the range of from 0.1 to 10, preferably 0.2 to 5% by weight of the solid component of the primer layer.

Typical examples of the pigments causing, per se, color change due to the action of light may be photochromic compounds and among others, organic photochromic materials are effective. The most effective and preferred examples are spiropyran compounds such as 1,3,3-trimethylindolinobenzopirylospiran, 1,3,3-trimethylindolino-6'-nitrobenzopirylospiran, 1,3,3-trimethylindolino-6'-bromobenzopirylospiran, 1,3,3-trimethylindolino-8'-methoxybenzopirylospiran, 1,3,3-trimethylindolino-6'-nitro-8'-methoxybenzopirylospiran, 1,3,3-trimethylindolino-5-methoxy-6'-methoxy-8'-nitropirylospiran, 1,3,3-trimethylindolino-5-chloro-6'-nitro-8'-methoxypirylospiran, 1,3,3-trimethylindolino-5-methoxy-6'-nitro-8'-methoxypirylospiran, 1,3,3-trimethylindolino-$\beta$-naphthopirylospiran.

These compounds may be used separately or a combination of two or more of them and the compounds are used in an amount of from 0.1 to 20, preferably 0.2 to 10% by weight of the solid component of the primer layer.

The photosensitive layer of photodimerizable resins which can be used in the present invention should be such that the overlying silicone rubber layer strongly adheres thereto and that the solubility thereof with regard to developers varies before and after exposure processes.

The photodimerizable photosensitive resins which satisfys the requirements described before, include polyesters, polycarbonates, polyamides, poly(metha)acrylic acid esters, polyvinylalcohol derivatives, epoxy resin derivatives which contain, in their backbone or side chain, phctodimerizable photosensitive groups such as those having the following structure:

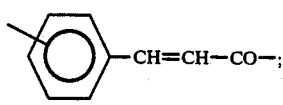

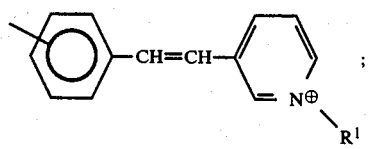

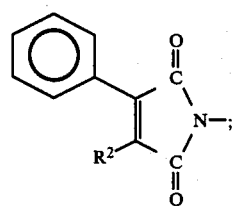

-continued

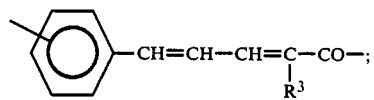

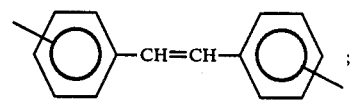

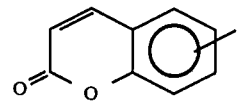

wherein $R^1$ represents an alkyl group having 1 to 10 carbon atoms and $R^2$ and $R^3$ stand for a hydrogen atom, a halogen atom, an alkyl group having 1 to 10 carbon atoms and an acyl group.

The molecular weight of these photodimerizable photosensitive resins is not critical so far as they are soluble in a solvent and, in general, it is effective to select resins having a molecular weight of from 1000 to several tens of thousands. Particularly preferred examples of such polymer include photosensitive polymers having photosensitive groups in their backbone such as photosensitive polyesters comprised of p-phenylene diacrylic acid and a diol, which are disclosed in the specification of U.S. Pat. Nos. 3,030,208 and 3,707,373; photosensitive polymers such as photosensitive polyester derived from a 2-properdinmalonic acid, for example, cinnamylidenemalonic acid and a bifunctional glycol disclosed in the specification of U.S. Pat. Nos. 2,956,878 and 3,173,787; photosensitive polymers such as cinnamates of hydroxyl group containing polymers, for instance, polyvinylalcohol, starch, cellulose and homologous thereof, which can be insolubilized by the action of active light.

The photosensitizers which can be incorporated in the layer of photosensitive resins include those disclosed in U.S. Pat. Nos. 2,610,120, 2,670,285, 2,670,286, 2,670,287, 2,690,966, 2,732,301, 2,835,656, 2,956,878, 3,023,100, 3,066,117, 3,141,770, 3,173,787, 3,357,831, 3,409,593, 3,418,295, 3,453,110, 3,475,617, 3,561,969, 3,575,929, 3,582,327, 3,647,470, 3,721,566, 3,737,319. Examples of the photosensitizer particularly useful in the present invention are 2-benzoylmethylene-1-methyl-$\beta$-naphthothiazoline, 5-nitroacenaphthene, $\beta$-chloroanthraquinone, 1,2-benzalanthraquinone, p,p'-tetraethyldiaminodiphenylketone, p,p'-dimethylaminobenzophenone, 4-nitro-2-chloroaniline. The preferred amount of these photosensitizer used falls within the range of from 0.5 to 15% by weight based on the weight of the polymer component and particularly preferred range is 2 to 8% by weight.

Moreover, in the photosensitive layer according to the present invention, it is also possible to incorporate other additives usually used in this field such as pigments, dyes, plasticizers, polymerization inhibitors according to need.

For example, as the polymerization inhibitor, there may be mentioned such as derivatives of hydroquinone, derivatives of phenol, benzenes substituted with nitro group(s), tertiary amines and derivatives of phenothiazine.

The thickness of the photosensitive layer explained above is desirably in the range of from 0.1 to 10 μm and preferably in the range of from about 0.1 to 0.5 μm, since the thickness thereof is preferably as thin as possible, in taking the ink receptivity of the highlight portion into consideration.

In the dry presensitized plate according to the present invention, at least one organotin compound and at least one silane coupling agents are incorporated in the photosensitive layer to improve the bonding strength between the primer layer and the photosensitive layer. This is one of the important characteristics of the present invention.

The organotin compounds as used in the invention are those represented by the following general formula:

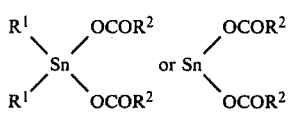

wherein R' represents an alkyl group having 1 to 6 carbon atoms and $R^2$ is an alkyl group having 1 to 20 carbon atoms. Typical examples thereof include dibutyltin dioctanoate, dibutyltin dilaurate, dibutyltin diacetate, tin (II) octanoate.

On the other hand, the silane coupling agent suitable for use in the photosensitive layer is preferably aminosilanes. The term "aminosilane" herein used means compounds represented by the following general formula:

RMR'nSi(OR")4—m—n wherein R means an alkyl group having unsubstituted or substituted amino groups and 1 to 10 carbon atoms, R' and R" represent an alkyl group preferably having 1 to 10 carbon atoms or an aryl group, m is an integer of 1 or 2 and n is 0 or 1, provided that m and n satisfy the relation: $m+n=1$ or 2.

Concrete examples of such aminosilane compound include 3-aminopropyltriethoxysilane, N-(2-aminoethyl)-3-aminopropyltrimethoxysilane, 3-aminopropyltrimethoxysilane, bis[3-(trimethoxysilyl)-propyl]-ethylenediamine, N-(3-trimethoxysilylpropyl)-morpholine, trimethoxysilylpropyldiethylenetriamine, bis(2-hydroxylethyl)-aminopropyltriethoxysilane, 3-aminopropylmethyldiethoxysilane, (N,N-diethyl-3-amino)-propyltrimethoxysilane, (N,N-dimethyl-3-amino)-propyltrimethoxysilane, N-methylaminopropyltrimethoxysilane, N-phenylaminopropyltrimethoxysilane, 1-trimethoxysilyl-2-(p-aminomethyl)-phenylethane, 1-trimethoxysilyl-2-(m-aminomethyl)-phenylethane, trimethoxysilylpropylallylamine.

Moreover, it is also possible to use aromatic aminosilane compounds having the following general formula:

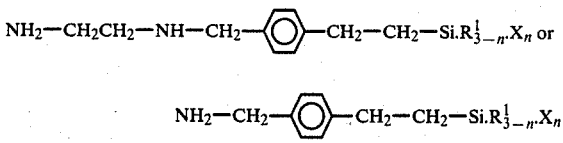

wherein n is an integer of 1 to 3, $R^1$ represents an alkyl group having 1 to 3 carbon atoms or a phenyl group and X represents a functional group, which can be hydrolized, such as those represented by the following formulas:

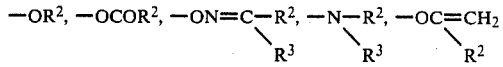

In these formulas, the substituents $R^2$ and $R^3$ represent a substituted or unsubstituted alkyl group having 1 to 3 carbon atoms.

In addition, reactive silane compounds having allylisocyanurate groups can be used as the aminosilane compound. There may be mentioned, such a reactive silane compound as those represented by the following general formula:

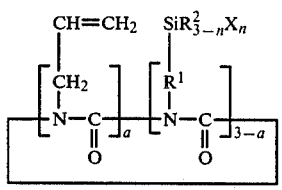

wherein $R^1$ represents a divalent group including at least one atom selected from the group consisting of carbon, oxygen, nitrogen, such as $-C_3H_6-$, $-C_3H_6-NH-C_3H_6-$, $R^2$ stands for an alkyl group having 1 to 3 carbon atoms of a phenyl group, X is a hydrolyzable functional group such as those represented by the following general formulas:

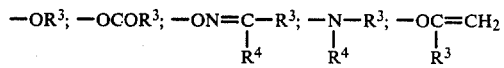

(wherein $R^3$ and $R^4$ independently represent a substituted or unsubstituted alkyl group having 1 to 3 carbon atoms), a is an integer of 1 to 2 and n is an integer of 1 to 3.

Reactive silane compounds having ketoxime groups can also be used as the aminosilane compound. Particularly preferred examples thereof include compounds having the following general formula:

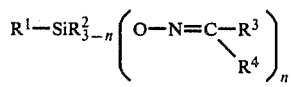

wherein $R^1$ represents a hydrogen atom; an alkyl group having 1 to 3 carbon atoms such as methyl, ethyl or propyl group; an alkenyl group having 2 to 5 carbon atoms such as vinyl or allyl group; an aminoalkyl group such as N-β-(aminoethyl)-γ-aminopropyl group or γ-aminopropyl group; an aminoalkylphenylalkylene group including aromatic rings in the alkylene chain, such as N-β-(aminoethyl)-aminomethylphenethyl group; γ-(metha)acryloxypropyl group; γ-glycidoxypropyl group; or γ-mercaptopropyl group, $R^2$ is an alkyl group having 1 to 3 carbon atoms or a phenyl group and $R^3$ and $R^4$ independently represent an alkyl group having 1 to 3 carbon atoms or $R^3$ and $R^4$ may be bonded at a part thereof to form a 5- to 6-membered cycloalkane together with the carbon atom to which they are bonded.

The total amount of the organotin compounds and the silane coupling agents incorporated in the photosensitive layer, in general, falls within the range of from 1 to 20% by weight based on the amount of the photosensitive resins, preferably 5 to 15% by weight.

The amount of these additives is critical in the dry presensitized plate according to the present invention and if the additives is used in an amount of less than the lower limit (1% by weight), the desired effect, i.e., the improvement of adhesiveness between the primer layer and the photosensitive layer is not expected, while if the amount used is more than 20% by weight, the properties of the photosensitive layer such as photosensitivity, developing property or the like are largely impaired and the resulting product is not commercially acceptable.

The ratio (by weight) of the amount of the organotin compound to that of the silane coupling agent should be in the range of from 0.2 to 5. This condition is also critical in the present invention and if these compounds are used in a ratio outside the above range, the adhesiveness between the primer layer and the photosensitive layer is not effectively improved, this being the case where these compounds are separately used.

These additives may be incorporated in the photosensitive layer, for instance, according to any one of the folowing two methods:

(A) a method comprising previously mixing a photosensitive resin an organotin compound, a silane coupling agent and other components together to form a photosensitive composition and then applying the composition to the primer layer preliminary formed on a substrate; or (B) a method comprising applying, in order, a primer layer and a photodimerizable photosensitive layer onto a substrate and then contacting a solution containing an organotin compound and a silane coupling agent with the surface of the photosensitive layer to cause penetration of the solution into the photosensitive layer.

The contact and penetration of the solution may, for instance, be carried out according to a method comprising applying the solution to the surface of the photosensitive layer by conventional coating equipment for example, reverse-roll coater, air-knife coater, rod coater or whirler or the method comprising a step of dipping or immersing a plate (substrate), on which a primer layer and a photosensitive layer are previously formed, in the solution or a method comprising spraying the solution onto the surface of the photosensitive layer.

In the process for contacting the solution with the photosensitive layer to cause penetration of the solution, the organotin compound and the silane coupling agent may be applied simultaneously as a single solution or applied two times utilizing these compounds separately.

When these compounds are applied to the photosensitive layer accoding to the method (B), the solution of these two compounds having a concentration of 0.1 to 20% by weight is preferred, if an organic solvent is used. The dry presensitized plate obtained by contacting the solution having the concentration falling within the above range with the photosensitive layer to cause penetration of the solution into the layer has the properties approximately identical to those of the dry presensitized plate obtained according to the process (A). As seen from this fact, it can be concluded that the content of the organotin compound and the silane coupling agent in the photosensitive layer obtained according to the method (B) also falls within the range of from 1 to 20% by weight.

The silicone rubber layer in the dry presensitized plate of the present invention is mainly composed of a linear organic polysiloxane having the following repeating unit and the molecular weight of several thousands to several hundreds of thousands:

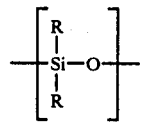

wherein each R independently represents an alkyl group having 1 to 10 carbon atoms or a phenyl group.

The preferred examples are organic polysiloxanes in which at least 60% of the total substituents R are methyl group. This kind of linear organic polysiloxanes are usually converted to crosslinked silicone rubber during the film-forming procedure by previously incorporating reactive crosslinking agents to the polysiloxane.

As the crosslinking agents used in the so-called room temperature (or low temperature) curing silicone rubber, there may be mentioned such as silanes, for instance, acetoxysilane, ketoximesilane, aminosilane, amidosilane, alkoxysilane; and their condensates having a low degree of polymerization, for instance, siloxanes and organohydrogen polysiloxanes. These compounds may or may not have monovalent organic groups bonded to silicon atom.

Moreover, it is also possible to incorporate silane coupling agents such as reactive silane compounds having allylisocyanurate groups or aminoalkyl groups so as to improve the adhesiveness between the photosensitive layer and the silicone rubber layer and effectively maintain the good adhesiveness between these two layers even after the elapse of a long period of time.

The reactive crosslinking agents and/or the reactive silane compounds are preferably added to the silicone rubber layer in an amount of from 0.05 to 10% by weight and more preferably 0.1 to 5% by weight. These additives can be used separately or as a combination of two or more of them.

In general, a small amount of a catalyst such as organotin compounds is also added to the silicone rubber layer.

The thickness of the silicone rubber layer is preferably as thin as possible from the viewpoint of reproducibility of tone and gradation and on the contrary, it should be thick in some degree to acertain a good durability in printing and to avoid scumming or tinting. Therefore, the thickness thereof is generally 0.5 to 10 μm and preferably 1.0 to 3.0 μm.

As already explained above, at least one silane coupling agent as the component for improving the adhesiveness between the photosensitive layer and the silicone rubber layer and at least one organotin compound as the catalyst for crosslinking reaction are optionally added to the silicone rubber layer. In other words, an organotin compound and a silane coupling agent are optionally added to the coating composition used to form the silicone rubber layer. However, in this case, it is not possible to attain the same effects as those accomplished in the case where the solution containing the organotin compound and the silane coupling agent is applied to and penetrated into the photosensitive layer. This is because, in such case, the kind and amount of the organotin compound and the silane coupling agent is largely limitted taking the influence on the properties of the silicone rubber layer obtained after coating of the composition into consideration and as a result these compounds cannot be incorporated in a sufficient amount to improve the adhesiveness between the primer layer and the photosensitive layer.

According to the present invention, the dry presensitized plate may also be provided with a protective layer on the silicone rubber layer according to need. Such protective layer may be a thin, plain or embossed film or sheet of polyethylen terephtharate, polyethylene, polypropylene, polystyrene, polyvinylchloride, polyvinylidenechloride, cellophane or the like. Such protective layer may be removed before image-wise exposure. While it is unnecessary to remove the protective film before image-wise exposure if the layer adequately transmits the light for exposing the presensitized plate and has a thickness of below 100 μm, and preferably below 30 μm, these conditions being quite important to assure the sharpness of image.

The dry presensitized plate of this invention having the structure explained above in detail can be used to form an excellent dry lithographic printing plate requiring no dampening water, according to the following procedures. That is, the dry lithographic printing plate can, for example, be produced by exposing the dry presensitized plate to light through an original transparent picture (for instance, a negative film) and then developing the plate with a developer capable of preferencially dissolving the unexposed portion of the photosensitive layer (image area) to remove the image area and the overlying silicone rubber layer.

Various kinds of light sources for exposing image can be utilized in the present invention. For example, high voltage mercury lamp, carbon arc lamp, metal halide lamp, xenon lamp, chemical lamp, fluorescent lamp, solar rays may be used.

Any known developers for conventional dry resensitized plates can be used for developing the dry presensitized plate according to the present invention. Preferred examples are aliphatic hydrocarbons such as hexane, heptane, "Iso Par E, H, G" (Trademarks of aliphatic hydrocarbons manufactured and sold by EXXON CHEMICALS IND. INC.), gasoline and kerosene; aromatic hydrocarbons such as toluene and xylene; or halogenated hydrocarbons, such as trichloroethylene to which the following polar solvent is added; water; alcohols such as methanol and ethanol; ethers such as methyl cellosolve, ethyl cellosolve, butyl cellosolve, methyl carbitol, ethyl carbitol, butyl carbitol and dioxane; ketones such as acetone and methyl ethyl ketone; or esters such as ethyl acetate, methyl cellosolve acetate, cellosolve acetate, and carbitol acetate.

Dyes such as Crystal Violet and Astrazone Red can be added to the developer to simultaneously dye image areas during development.

The development can be carried out according to any one of the conventional methods, for example, by rubbing the image-wise exposed plate with a developing pad which is previously soaked in the aforementioned developer and thus contains the same, or by pouring the developer on the exposed plate and then rubbing it with a developing brush.

At this stage, the silicone rubber layer and the photosensitive layer in image area are removed and the surface of the portion of the primer layer corresponding to the image areas is exposed, which provides ink receiving areas.

The dry presensitized plate according to the present invention has a quite wide developing latitude and improved fine dot reproduction since the adhesiveness between the primer layer and the photosensitive layer is remarkably improved or enhanced by incorporating a combination of organotin compounds and silane coupling agents into the photosensitive layer, thereby the release between these two layers is not caused even if the presensitized plate is subjected to a quite strong development. Furthermore, according to a preferred embodiment of this invention, the primer layer has the image printing out property and therefore, the dry presensitized plate easily provides, after exposure, visible images even under the irradiation of yellow light. The resulting dry planographic plate requiring no dampening water obtained by developing the dry presensitized plate of the invention has excellent printing properties compared with those of the prior Art.

The dry presensitized plate according to the present invention will now be explained in more detail with reference to the practical Examples which simply illustrates the invention and do not limit the scope of this invention.

EXAMPLE 1

A smooth aluminum plate degreased according to a conventional technique was coated with a composition for primer layer having the following composition so as to form a layer of 2.0 g/m$^2$ (dry weight) and cured by heating the layer at 120° C. for 5 minutes:

| Component | Amount (parts by weight) |
|---|---|
| EPIKOTE 1001 (bisphenol A type epoxy resin manufactured and sold by Shell Chemical Co. Ltd.: epoxy equivalent thereof = 450–500) | 100 |
| Methyltetrahydrophthalic acid anhydride | 36 |
| 2,4,6-Tris (dimethylaminomethyl)-phenol | 10 |
| Methyl cellosolve acetate | 600 |
| Toluene | 600 |
| Methyl ethyl ketone | 600 |

The primer layer applied to the aluminium plate and cured was not dissolved in the developing solution or a mixed solvent for applying the photosensitive layer (methyl cellosolve acetate/toluene=2/1 (by weight)) even when the plate was immersed therein.

On the primer layer applied to the aluminium plate, the following photosensitive composition containing the organotin compound and the silane coupling agent was applied so as to obtain a photosensitive layer of 0.25 g/m$^2$ (dry weight).

| Component | Amount (parts by weight) |
|---|---|
| Photosensitive unsaturated polyester obtained by polycondensation of p-phenylene diacrylic acid ester and 1,4-dihydroxyethyloxycyclohexane (1:1 molar ratio) | 10 |
| 1-Methyl-2-benzoylmethylene-β-naphthothiazoline | 0.6 |
| N—(β-Aminoethyl)-aminomethyl- | 0.4 |

| Component | Amount (parts by weight) |
| --- | --- |
| phenethyltrimethoxysilane | |
| Dibuthyl tin dioctanoate | 0.8 |
| Sumitone Cyanine Blue VH 514 (Phthalocyanine Blue Pigment manufactured and sold by SUMITOM CHEMICAL INDUSTRIES Co. Ltd. | 2 |
| Methyl cellosolve acetae | 600 |
| Toluene | 300 |

Then, the following silicone rubber composition was applied to the surface of the resulting photosensitive layer so as to form a silicon rubber layer of 2.0 g/m² (dry weight) and dried to cure the silicone rubber layer:

| Component | Amount (parts by weight) |
| --- | --- |
| Dimethyl polysiloxane having hydroxyl group at both of its terminal ends (molecular weight of about 600,000) | 100 |
| Methyl hydrogen polysiloxane having trimethylsilyl group at both of its terminal ends (molecular weight of about 2,500) | 3.5 |
| 1-Methoxysilylpropyl-3,5-diallylisocyanarate | 3.3 |
| Dibutyl tin dioctanoate | 3.3 |
| ISO PAR G (manufactured and sold by EXXON CHEMICALS IND. INC.) | 2,000 |

On the surface of the resulting cured silicone rubber layer, there was laminated a polypropylene film, one side thereof being matted and having the thickness of 12 μm, and thus the dry presensitized plate of the present invention was obtained.

The presensitized plate was exposed for 30 counts through a positive film disposed thereon in close contact state using ET26V UDNG ULTRA-PLUS FLIP-TOP PLATE MAKER (manufactured and sold by nuARC IND. INC.). Then, the film laminated thereon was removed by peeling and immersed for one minute in a developer composed of 90 parts by weight of ISO PAR H (manufactured and sold by EXXON CHEMICALS IND. INC.), 7 parts by weight of diethyleneglycol monobutyl ether, 3 parts by weight of diethyleneglycol monoethyl ether and 5 parts by weight of diethyl succinate and then lightly rubbed with a developing pad for 1 to 2 minutes to remove the unexposed portion of the photosensitive layer and the silicone rubber layer. Thus, the dry planographic printing plate was obtained and the image of the positive film was precisely reproduced on the whole surface of the lithographic plate.

This printing plate was then set on Heiderberg GTO printing machine from which the apparatus for feeding the dampening water was removed and printing was carried out using BLACK ink, TOYO KING ULTRA TUR AQUALESS G produced by TOYO INK Co. Thus, 20,000 copies having no background contamination were obtained and the high light portion was also effectively reproduced.

Moreover, it was found that the planographic printing plate made it possible to maintain the precise image of the positive film and provide a wide developing latitude even when it was strongly developed in the same developer as used above (and even when the plate was strongly rubbed for 5 minutes).

EXAMPLE 2

The procedures of the Example 1 were repeated, except that the following photsensitive composition was used and applied so as to obtain a photosensitive layer of 0.25 g/m² (dry weight).

| Component | Amount (parts by weight) |
| --- | --- |
| Photosensitive unsaturated polyester obtained by the polycondensation of p-phenylene diacrylic acid ester and 1,4-dihydroxyethyloxycyclohexane (1:1 molar ratio) | 10 |
| 1-Methyl-2-benzoylmethylene-β-naphthothiazoline | 0.6 |
| SUMITONE CYANITE BLUE VH-514 (Phthalocyanine Blue pigment manufactured and sold by SUMITOM CHEMICAL INDUSTRIES Co. Ltd.) | 2 |
| Methyl cellosolve | 600 |
| Toluene | 300 |

Then, the following composition containing an organation compound and a silane coupling agent was applied to the surface of the resulting photosensitive layer using a whirler (number of revolutions=120 rpm) to cause contact of the composition with the layer and penetration of the composition into the layer and then the layer was dried at 120° C. for 2 minutes.

| Component | Amount (parts by weight) |
| --- | --- |
| N—(β-Aminoethyl)-aminomethyl-phenethyltrimethoxysilane | 0.1 |
| Dibutyl tin dioctanoate | 0.2 |
| ISO PAR G (manufactured and sold by EXXON CHEMICALS IND. INC.) | 100 |

A dry presensitized plate was produced by applying the same composition for the silicone rubber layer as that used in the Example 1 and laminating the resulting plate with the same polypropylene film as that of the Example 1.

The resulting dry presensitized plate was treated according to the same procedures as in the Example 1 to obtain a dry planographic printing plate. It was found that on the resulting planographic printing plate the precise image of the positive film could be reproduced and it had a wide developing latitude even if the plate was subjected to a rather strong development.

EXAMPLE 3

The primer layer and the photosensitive layer were formed, in order, on the substrate according to the procedures of the Example 1, then the following composition containing an organotin compound and a silane coupling agent was applied to the surface of the photosensitive layer utilizing a whirler (number of revolutions=120 rpm) to penetrate the composition into the photosensitive layer and the layer was dried by heating at 120° C. for 2 minutes.

| Component | Amount (parts by weight) |
| --- | --- |
| 1-Methoxysilylpropyl-3,5-diallyl-isocyanurate | 0.2 |
| Dibutyl tin dioctanoate | 0.2 |
| ISO PAR G (manufactured and sold by EXXON CHEMICALS IND. INC.) | 100 |

A dry lithographic plate was produced by applying the same silicone rubber composition as that used in the Example 1 to the top of the photosensitive layer and laminating the plate with the same polypropylene film as used in the Example 1.

The dry presensitized plate thus obtained was treated or processed according to the same procedures as in the Example 1 to form a dry lithographic printing plate. It was observed that on the printing plate the precise image of the positive film was reproduced and the developing latitude of the printing plate was sufficiently wide even when the presensitized plate was strongly developed.

COMPARATIVE EXAMPLE 1

According to the procedures of the Example 1, except that the photosensitive layer did not contain the organotin compound and the silane coupling agent, a dry presensitized plate was produced for the purpose of comparison.

The resulting dry presensitized plate was treated according to the same procedures as in the Example 1 to produce a comparative dry planographic printing plate. However, it was observed that a sufficient image reproducibility was not attained when the plate was subjected to a strong developing process. This is because, the photosensitive layer was peeled off from the adjacent primer layer due to low adhesiveness between them.

COMPARATIVE EXAMPLES 2 TO 4

The primer layer was formed on the substrate according to the procedures of the Example 1. Then, the following photosensitive compositions, each of which contains either the silane coupling agent or the organotin compound as listed in Table I, were applied to the top of the primer layer respectively to obtain photosensitive layers of 0.25 g/m² (dry weight) and dried to complete the photosensitive layer.

| Component | Amount (parts by weight) |
| --- | --- |
| Photosensitive unsaturated polyester obtained by the polycondensation of p-phenylene diacrylic acid ester and 1,4-dihydroxyethyloxycyclohexane (1:1 molar ratio) | 10 |
| 1-Methyl-2-benzoylmethylene-β-naphthothiazoline | 0.6 |
| SUMITONE CYANINE BLUE VH-514 (Phthalocyanine Blue pigment manufactured SUMITOMO CHEMICAL IND. Co. Ltd.) | 2 |
| Methyl cellosolve acetate | 600 |
| Toluene | 300 |

TABLE I

| Comp. Ex. No. | Additive | Amount (parts by weight) |
| --- | --- | --- |
| 2 | N—(β-Aminoethyl)-aminomethyl-phenethyltrimethoxysilane | 0.4 |
| 5 | 1-Methoxysilylpropyl-3,5-diallylisocyanurate | 0.8 |
| 4 | Dibutyl tin dioctanoate | 0.8 |

A presensitized plate was prepared by applying, in order, the same silicone rubber composition and laminate layer of polypropylene film as those used in the Example 1 to the surface of the photosensitive layer.

The presensitized plate thus obtained was then treated according to the procedures similar to those of the Example 1 to form a dry lithographic printing plate, provided that the plate was subjected to a quite strong development. As a result, the dry lithographic printing plate caused the release between the primer layer and the photosensitive layer and did not provide a sufficient image reproducibility.

COMPARATIVE EXAMPLES 5 TO 7

According to the similar procedures as in the Example 2, a dry presensitized palte was produced by applying a primer layer and a photosensitive layer to a substrate, then coating a composition containing either the organotin compound or the silane coupling agent separately (each specific additive being listed in the following Table II) with the whirler (number of revolution=120 rpm) to penetrate the composition into the photosensitive layer and then drying the product by heating it to 120° C. for 2 minutes.

TABLE II

| Comp. Ex. No. | Organotin Compound or Silane Coupling Agent Used | Amount (parts by weight) |
| --- | --- | --- |
| 5 | N—(β-Aminoethyl)-aminomethylphenethyl-trimethoxysilane | 0.1 |
|  | ISO PAR G (manufacatured and sold by EXXON CHEMICALS IND. INC.) | 100 |
| 6 | 1-Methoxysilylpropyl-3,5-diallylisocyanurate | 0.2 |
|  | ISO PAR G | 100 |
| 7 | Dibutyl tin dioctanoate | 0.2 |
|  | ISO PAR G | 100 |

Then, a dry presensitized plate was completed by applying the same silicone rubber composition and laminate layer of polypropylene film as those of the Example 1.

The dry presensitized plate was them treated according to the procedures similar to the preceding Example 1 to obtain a dry lithographic printing plate, except that the presensitized plate was strongly developed. However, it was observed that the resulting printing plates suffered from the release between the primer layer and the photosensitive layer and therefore did not provide a good image reproducibility commercially acceptable.

Although, the dry presensitized plate according to the present invention has been explained in detail, in connection with the preferred and non-limitative examples or embodiments, it is not intended to restrict the scope of this invention to the particular form as set forth above, on the contrary, it is intended to cover various kinds of alternatives, modifications and equivalents as may be included within the spirit and scope of the invention as defined by the appended claims. As such modifications, there may be mentioned such as the dry presensitized plate in which an adhesive layer is provided between the photosensitive layer and the silicone rubber layer, which may be compared of a various kind of reactive crosslinking agents, silane coupling agents. Among others, preferred examples thereof are silane coupling agents having an oxime group, reactive silicone compounds having an aminoalkyl group, reactive silane compounds having an allylisocyanurate, organic titanate compounds (titanium type primer), or the like.

What is claimed is:

1. A dry presensitized plate which comprises a substrate having provided thereon a primer layer, a photodimerizable photosensitive layer and a silicone rubber layer in order, wherein:
   (a) at least one organotin compound and at least one silane coupling agent are incorporated in the photosensitive layer,
   (b) the total amount of the organotin compound and the silane coupling agent incorporated in the photosensitive layer falls within the range of from 1 to 20% by weight of the photosensitive resin,
   (c) the weight ratio of the organotin compound to the silane coupling agent is from 0.2 to 5,
   (d) the organotin compound is a member selected from the group consisting of those having the following general formula:

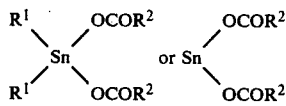

wherein $R^1$ represents an alkyl group having 1 to 6 carbon atoms; and $R^2$ represents an alkyl group having 1 to 20 carbon atoms, and a mixture thereof,
   (e) the silane coupling agent is a member selected from the group consisting of aminosilanes represented by the following general formula:

wherein R is an alkyl group having 1 to 10 carbon atoms and substituted with substituted or unsubstituted amino groups, R' and R'' are an alkyl group having 1 to 10 carbon atoms or an aryl group independently, m is an integer of 1 to 2 and n is zero or 1, provided that m and n satisfy the relation: m+n=1 or 2, aromatic aminosilanes represented by the following general formula:

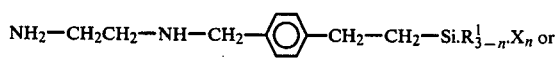 or

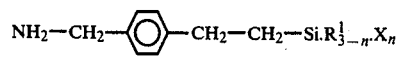

wherein n is an integer of 1 to 3, $R^1$ is an alkyl group having 1 to 3 carbon atoms or a phenyl group and X represents a hydrolyzable functional group represented by the following formula:

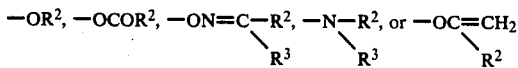

wherein $R^2$ and $R^3$ represent substituted or unsubstituted alkyl group having 1 to 3 carbon atoms, reactive silane compounds represented by the following general formula:

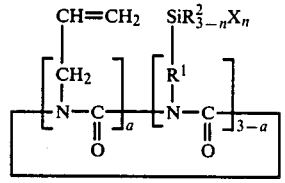

where $R^1$ represents a divalent group including at least one atom selected from the group consisting of carbon, oxygen, nitrogen, such as —$C_3H_6$—, $C_3H_6$—NH—$C_3H_6$—, $R^2$ stands for an alkyl group having 1 to 3 carbon atoms or a phenyl group, X is a hydrolyzable functional group such as those represented by the following general formulas:

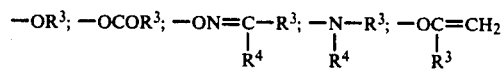

wherein $R^3$ and $R^4$ independently represent a substituted or unsubstituted alkyl group having 1 to 3 carbon atoms, a is an integer of 1 to 2 and n is an integer of 1 to 3, reactive silane compounds represented by the following general formula:

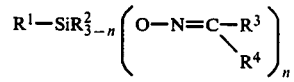

wherein $R^1$ represents a hydrogen atom; and alkyl group having 1 to 3 carbon atoms such as methyl, ethyl or propyl group; an alkenyl group having 2 to 5 carbon atoms such as vinyl or allyl group; and aminoalkyl group such as N-β-(aminoethyl)-γ-aminopropyl group or γ-aminopropyl group; an aminoalkylphenylalkylene group including aromatic rings in the alkylene chain, such as N-β-(aminoethyl)-aminomethylphenethyl group; γ-(metha)acryloxypropyl group; γ-glycidoxypropyl group; or γ-mercaptopropyl group, $R^2$ is an alkyl group having 1 to 3 carbon atoms or a phenyl group and $R^3$ and $R^4$ independently represent an alkyl group having 1 to 3 carbon atoms or $R^3$ and $R^4$ may be bonded at a part thereof to form a 5- to 6-membered cycloalkane together with the carbon atom to which they are bonded, and mixtures thereof, and
   (f) the primer layer strongly adheres to the adjacent photosensitive layer and the substrate, receives ink, and has resistance to the solvent of a developer used.

2. The dry presensitized plate as set forth in claim 1, wherein a protective layer is applied onto the surface of the silicon rubber layer.

3. The dry presensitized plate as set forth in claim 1, wherein the primer layer is comprised of an epoxy resin.

4. The dry presensitized plate as set forth in claim 3, wherein the epoxy resin is a member selected from the group consisting of a reaction product of bisphenol A and epichlorohydrin, bisphenol F and epichlorohydrin, a novolak resin and epichlorohydrin, or tetrabromobisphenol A and epichlorohydrin; cycloaliphatic epoxy resins; glycidyl ester type epoxy resins; glycidyl amine type epoxy resins; and heterocyclic epoxy resins.

5. The dry presensitized plate as set forth in claim 4 in which the epoxy resin is that represented by the following formula:

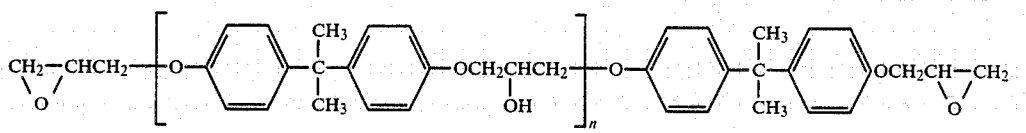

wherein n is an integer of 0 to 20.

6. The dry presensitized plate as set forth in claim 5 in which the epoxy resin has an epoxy equivalent of 180 to 4,000.

7. The dry presensitized plate as set forth in claim 1 in which the total amount of the organotin compound and the silane coupling agent is from 1 to 20% by weight of the photosensitive resin, the weight ratio of the organotin compound to the selane coupling agent is from 0.2 to 5 and the primer layer has the image printing out property.

8. The dry presensitized plate as set forth in claim 7 in which the primer layer is composed of an epoxy resin.

9. The dry presensitized plate as set forth in claim 8 in which the epoxy resin is a member selected from the group consisting of a reaction product of bisphenol A, bisphenol F, tetrabromobisphenol A or a novolak resin with epichlorohydrin; cycloaliphatic epoxy resins; glycidyl ester type epoxy resins; glycidylamine type epoxy resins; and heterocyclic epoxy resins.

10. The dry presensitized plate as set forth in claim 9 in which the epoxy resin is that represented by the following formula:

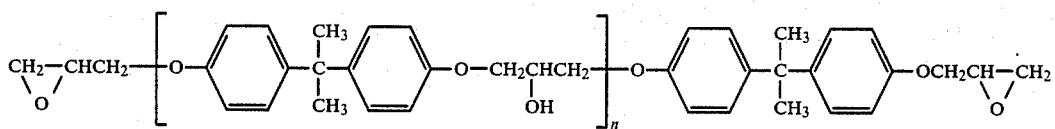

wherein n is an integer of 0 to 20.

11. The dry presensitized plate as set forth in claim 10 in which the epoxy resin has an epoxy equivalent of 180 to 4,000.

12. The dry presensitized plate as set forth in claim 7 in which the organotin compound is a member selected from the group consisting of those having the following general formula:

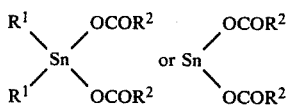

wherein $R^1$ represents an alkyl group having 1 to 6 carbon atoms and $R^2$ represents an alkyl group having 1 to 20 carbon atoms and a mixture thereof.

13. The dry presensitized plate as set forth in claim 7 in which the silane coupling agent is a member selected from the group consisting of aminosilanes represented by the following general formula:

$$R_m R'_n Si(OR'')_{4-m-n}$$

wherein R is an alkyl group having 1 to 10 carbon atoms and substituted with substituted or unsubstituted amino groups, R' and R'' are an alkyl group having 1 to 10 carbon atoms or an aryl group independently, m is an integer of 1 or 2 and n is zero or 1, provided that m and n satisfy the relation: m+n=1 or 2, aromatic aminosilanes represented by the following general formula:

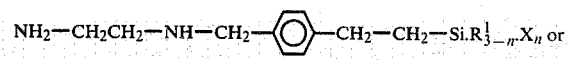

wherein n is an integer of 1 to 3, R' is an alkyl group having 1 to 3 carbon atoms or a phenyl group and X represents a hydrolyzable functional group represented by the following general formula:

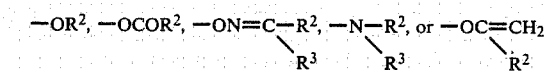

wherein $R^2$ and $R^3$ represent a substituted or unsubstituted alkyl group having 1 to 3 carbon atoms, reactive silane compounds represented by the following general formula:

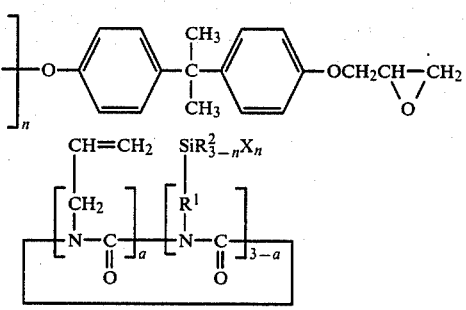

wherein $R^1$ represents a divalent group including at least one atom selected from the group consisting of carbon, oxygen, nitrogen, such as —$C_3H_6$—, —$C_3H_6$—NH—$C_3H_6$—, $R^2$ stands for an alkyl group having 1 to 3 carbon atoms or a phenyl group, X is a hydrolyzable functional group such as those represented by the following general formulas:

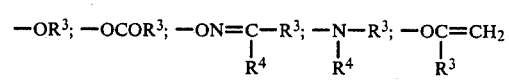

wherein $R^3$ and $R^4$ independently represent a substituted or unsubstituted alkyl group having 1 to 3 carbon atoms, a is an integer of 1 to 2 and n is an integer of 1 to 3 and mixtures thereof.

14. The dry presensitized plate as set forth in claim 7 in which a protective layer is applied to the surface of the silicon rubber layer.

* * * * *